United States Patent
Chou

(10) Patent No.: US 6,800,841 B1
(45) Date of Patent: Oct. 5, 2004

(54) TILT SWITCH

(76) Inventor: Tien-Ming Chou, No. 41, San-Hsi 5th St., Taichung City (TW)

(*) Notice: Subject to any disclaimer, the term of this patent is extended or adjusted under 35 U.S.C. 154(b) by 0 days.

(21) Appl. No.: 10/812,459

(22) Filed: Mar. 30, 2004

Related U.S. Application Data

(63) Continuation-in-part of application No. 09/957,932, filed on Sep. 21, 2001.

(51) Int. Cl.[7] ................................................. G01D 5/34
(52) U.S. Cl. .................. 250/231.1; 250/239; 33/366.11
(58) Field of Search .............................. 250/231.1, 239, 250/221, 222.1, 216, 229; 33/366.11, 366.12, 366.23; 73/514.19, 514.26; 340/689; 200/61.45 R

(56) References Cited

U.S. PATENT DOCUMENTS 6,011,254 A * 1/2000 Sano et al. ............... 250/231.1
6,140,635 A   10/2000 Kazumi et al.
6,392,223 B1 * 5/2002 Hjertman et al. ........ 250/231.1

* cited by examiner

Primary Examiner—Thanh X. Luu
Assistant Examiner—Seung C. Sohn
(74) Attorney, Agent, or Firm—Brooks Kushman P.C.

(57) ABSTRACT

A tilt switch includes a housing body with a modular concavity, light emitting and receiving units disposed in the housing body, a modular insert body inserted into the concavity and having an entry hole for admitting entry of only a portion of a light beam emitting from the emitting unit so as to form a narrower beam of incident light that travels in a light path, and an accommodation chamber with a transit route which extends to intersect the light path at an intersection, a ball member received in the chamber and rollable across the intersection when the housing is tilted, an optoelectronic sensor member that shifts the state of the switch when the ball member is lurched as a result of tilting for interrupting or restoring the transmission of the light beam, and a modular cover disposed to cover the concavity.

10 Claims, 16 Drawing Sheets

TILT SWITCH

CROSS-REFERENCE TO RELATED APPLICATION

This application is a continuation-in-part of U.S. patent application Ser. No. 09/957,932, filed by the applicant on Sep. 21, 2001, the entire disclosure of which is incorporated herein by reference.

BACKGROUND OF THE INVENTION

1. Field of the Invention

This invention relates to a tilt switch, more particularly to a tilt switch with an optoelectronic sensor member which is controlled by the displacement of a ball member to make or break electrical connection between two electric contact terminals.

2. Description of the Related Art

In the co-pending U.S. patent application Ser. No. 09/957,932, filed by the applicant, there is disclosed a tilt switch that includes light emitting and receiving units disposed in an insulating housing, a ball member received rollably in an accommodation chamber of the housing. When the housing is tilted, the ball member can roll between a first position and a second position so that a light beam emitting from the light emitting unit is permitted to be received by the light receiving unit or is blocked such that an optoelectronic switch can change from a first switch state to a second switch state.

SUMMARY OF THE INVENTION

The object of the present invention is to provide a tilt switch with a modular insert body that is replaceable to enable the tilt switch to have various degrees of sensitivity so as to be used for different kinds of electric apparatus.

According to this invention, the tilt switch includes a housing body adapted to be mounted on a support in an upright direction, and includes a top wall which extends in a longitudinal direction that is transverse to the upright direction, and which has a modular concavity extending downwardly, a bottom wall which has a bottom wall surface that confronts the concavity and that is spaced apart from the top wall by a modular depth, and right and left inner modular walls which are spaced apart from each other by a modular width to confine the concavity in the longitudinal direction, and which respectively have emitting and receiving slits that extend respectively therethrough in both the longitudinal and upright directions, and that are aligned with each other in the longitudinal direction to permit passage of a broader beam of light. Light emitting and receiving units are disposed in the housing body, and are respectively disposed rightwardly and leftwardly of the right and left inner modular walls to emit and to receive the broader beam of light that passes through. the emitting and receiving slits. A modular insert body includes entry and exit walls, and an inner peripheral wall. The entry and exit walls are opposite to and are distant from each other in the longitudinal direction by a modular thickness that is slightly smaller than the modular width. The entry wall has an entry hole which extends in the longitudinal direction and towards the exit wall, and which is configured to admit entry of only a portion of the broader beam of light into the entry hole, thereby forming a narrower beam of incident light in the entry hole so as to continue to pass through the receiving slit along a light path when the modular insert body is inserted into the concavity in the upright direction to contact the bottom wall surface of the bottom wall and when the entry and exit walls are brought to confront the right and left inner modular walls, respectively. The inner peripheral wall is disposed between the entry and exit walls to confine an accommodation chamber which extends in the longitudinal direction to communicate with the entry hole, and which ha a transit route that extends to intersect the light path at an intersection. A ball member is received in the accommodating chamber, is rollable across the intersection, and is displaceable from a first position where the housing body is steady in the upright direction, to a second position where the housing body is tilted relative to the upright direction. An optoelectronic sensor member is secured to the housing body, and includes two electric contact terminals which extend downwardly and outwardly of the housing body so as to be adapted to be connected electrically to the support, and an optoelectronic switch which electrically couples the electric contact to the light receiving unit such that the optoelectronic switch shifts from a first switch state to a second switch state when the ball member is lurched as a result of tilting to roll across the intersection from the first position to the second position, thereby interrupting or restoring the transmission of the narrower beam of incident light. A modular cover is configured to cover the modular concavity so as to prevent ambient light from entering thereinto.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
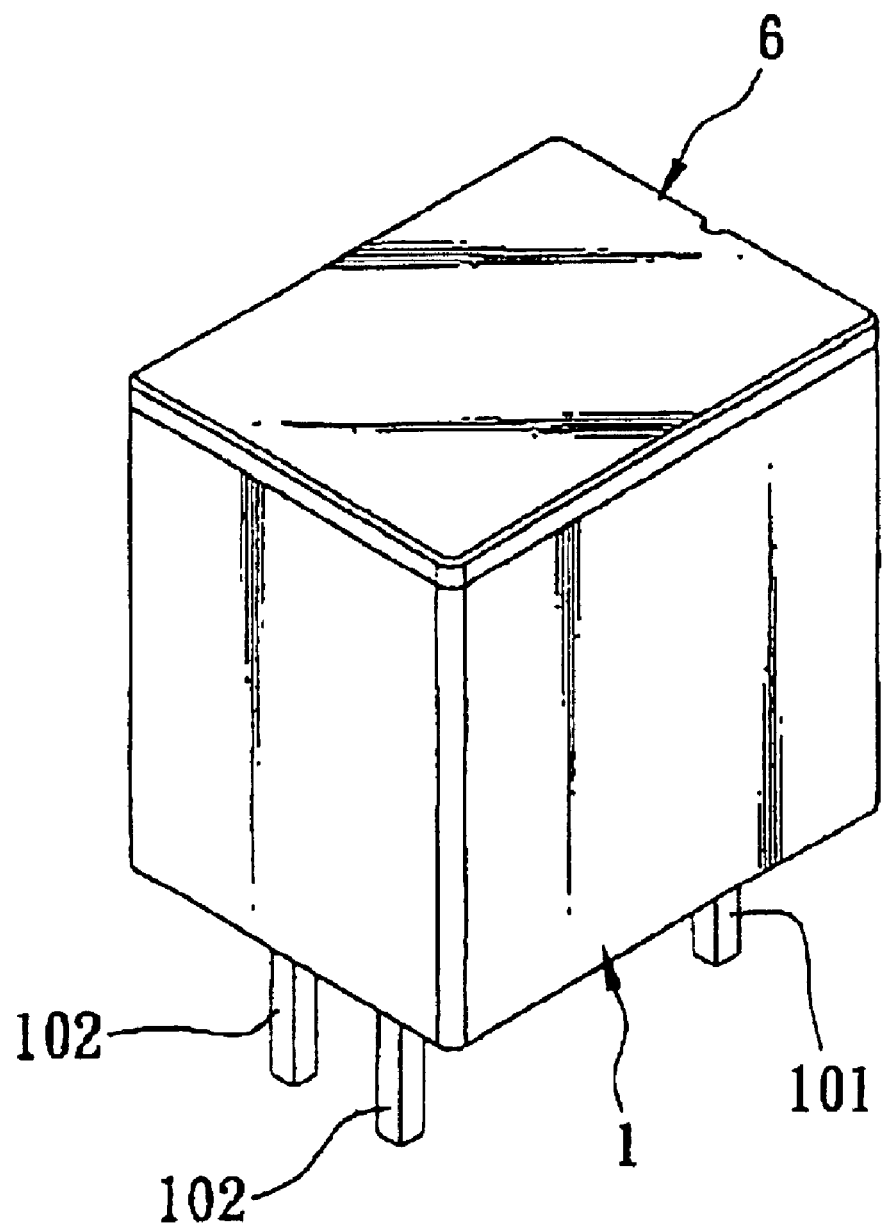
FIG. 1 is a perspective view of a first preferred embodiment of a tilt switch according to this invention.
Figure 2:
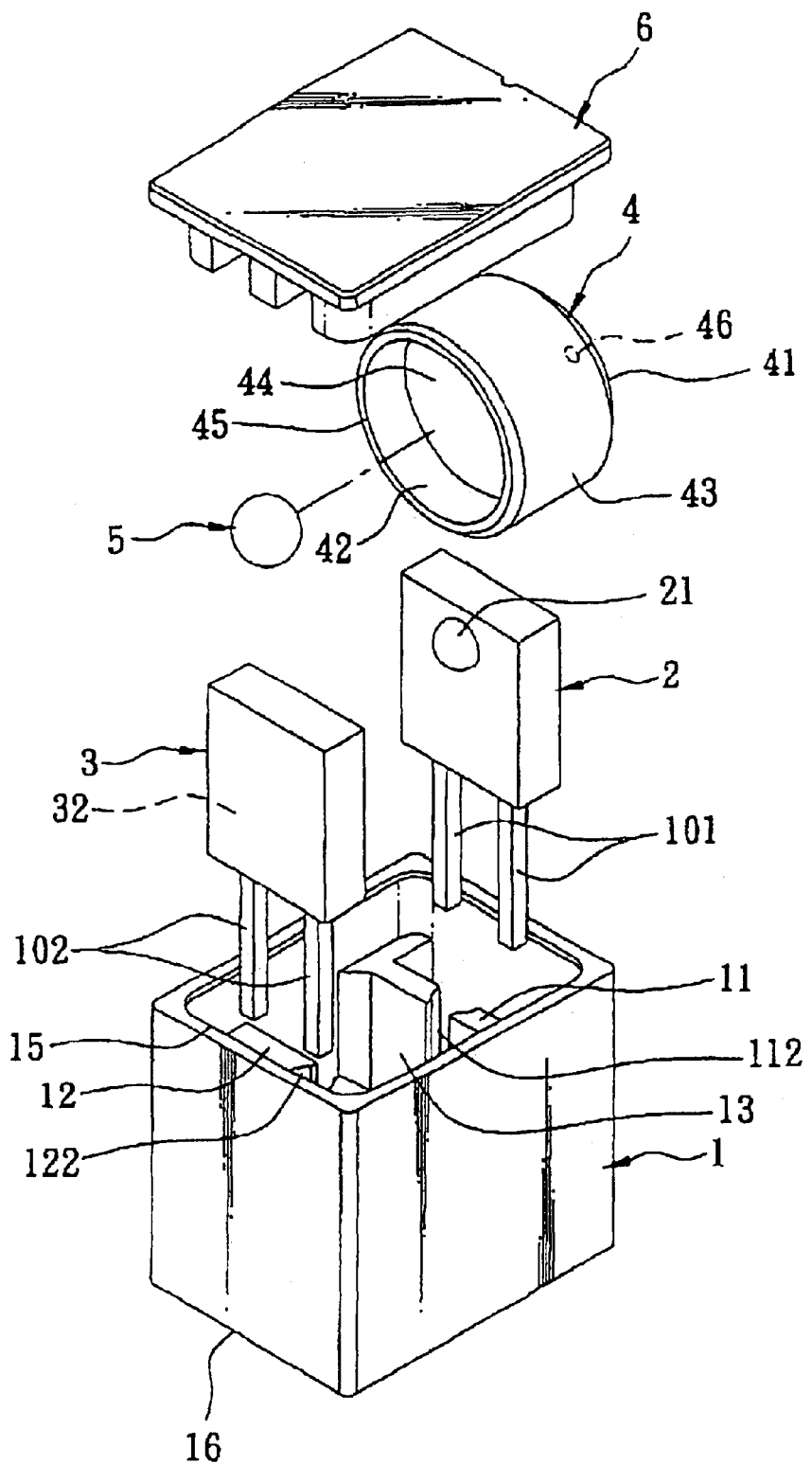
FIG. 2 is an exploded perspective view of the first preferred embodiment.
Figure 3:
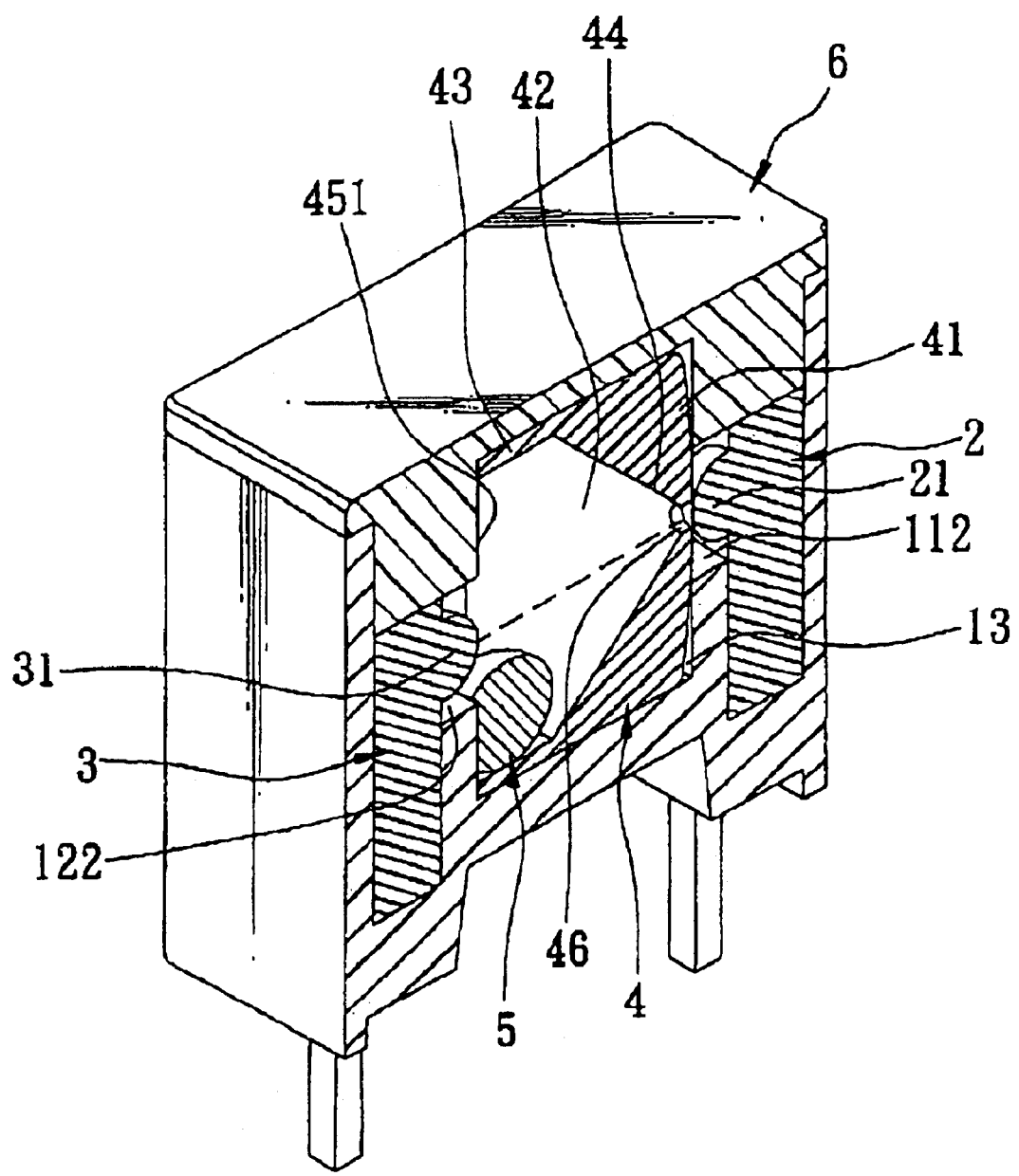
FIG. 3 is a partly sectional schematic view of the first preferred embodiment in an upright state.

Referring to FIGS. 1 to 3, the first preferred embodiment of a tilt switch according to the present invention is adapted to be in electrical contact with a support (not shown), and is shown to comprise an insulating housing body 1, light emitting and receiving units 2,3, an optoelectronic sensor member, a modular insert body 4, a ball member 5, and a modular cover 6.

The housing body 1 is adapted to be mounted on the support in an upright direction, and is made of a plastic material. The housing body 1 includes a top wall 15 which extends in a longitudinal direction that is transverse to the upright direction, and which has a modular concavity 13 extending downwardly, a bottom wall 16 which has a bottom wall surface that confronts the concavity 13 and that is spaced apart from the top wall 15 by a modular depth, and right and left inner modular walls 11,12 which are spaced apart from each other by a modular width to confine the concavity 13 in the longitudinal direction, and which have emitting and receiving slits 112,122 that extend respectively therethrough in both the longitudinal direction and the upright direction, and that are aligned with each other in the longitudinal direction to permit passage of a broader beam of light.

The light emitting and receiving units 2,3 are disposed in the housing body 1, and are respectively disposed rightwardly and leftwardly of the right and left inner modular walls 11,12 to emit and to receive the broader beam of light that passes through the emitting and receiving slits 112,122. The light emitting unit 2 is a known infrared light emitter with an emitting point 21 disposed in the emitting slit 112. The light receiving unit 3 has a receiving point 31 disposed in the receiving slit 122 and facing the light emitting point 21. Two electric contact terminals 101 are disposed to extend downwardly and outwardly of the housing body 1 so as to connect electrically with an electrical power unit (not shown) of the support.

The modular insert body 4 includes entry and exit walls 41,45 which are opposite to and which are distant from each other in the longitudinal direction by a modular thickness that is slightly smaller than the modular width, and a cylindrical inner peripheral wall 43 which is disposed between the entry and exit walls 41,45 to confine an accommodation chamber 42 extending in the longitudinal direction.

The entry wall 41 has an entry hole 46 which extends in the longitudinal direction and towards the exit wall 45, and which is configured to admit entry of only a portion of the broader beam of light thereinto, thereby forming a narrower beam of incident light in the entry hole 46 so as to continue to pass through the receiving slit 122 along a light path when the modular insert body 4 is inserted into the concavity 13 in the upright direction to contact the bottom wall surface of the bottom wall 16, and when the entry and exit walls 41,45 are brought to confront the right and left inner modular walls 11,12, respectively. The entry wall 41 has a rolling surface 44 which includes a central area and a surrounding area surrounding the central area, and which is inclined from the surrounding area to the central area radially and in the longitudinal direction. The entry hole 46 is formed in the central area and extends along the light path to communicate with the accommodation chamber 42. Thus, the accommodation chamber 42 has a transit route that extends to intersect the light path at an intersection.

The inner peripheral wall 43 has an inner cylindrical wall surface which extends from the surrounding area of the rolling surface 44 in the longitudinal direction to confine the accommodation chamber 42 and which terminates at the exit wall 45 to define a left access opening 451, and an outer cylindrical wall surface which surrounds the light path and which has a lower abutment region that abuts against the bottom wall surface of the bottom wall 16 when the modular insert body 4 is inserted into the concavity 13.

The ball member 5 is made of copper alloy, iron alloy or gilding material, and is received in the accommodation chamber 42 from the left access opening 451. The ball member 5 is rollable to be located at the surrounding area in a first position, where the housing body 1 is steady in the upright direction, or at the central area in a second position, where the housing body 1 is tilted relative to the upright direction.

The optoelectronic sensor member is secured to the housing body 1, and includes two electric contact terminals 102 which extend downwardly and outwardly of the housing body 1 so as to be adapted to be connected electrically to the support, and an optoelectronic switch 32 which electrically couples the electric contact terminals 102 to the light receiving unit 3.

The modular cover 6 is disposed to cover the modular concavity 13 so as to prevent ambient light from entering thereinto, and has a lower abutment surface which abuts against the modular insert body 4 so as to press the modular insert body 4 against the bottom wall surface of the bottom wall 16.

Figure 4:
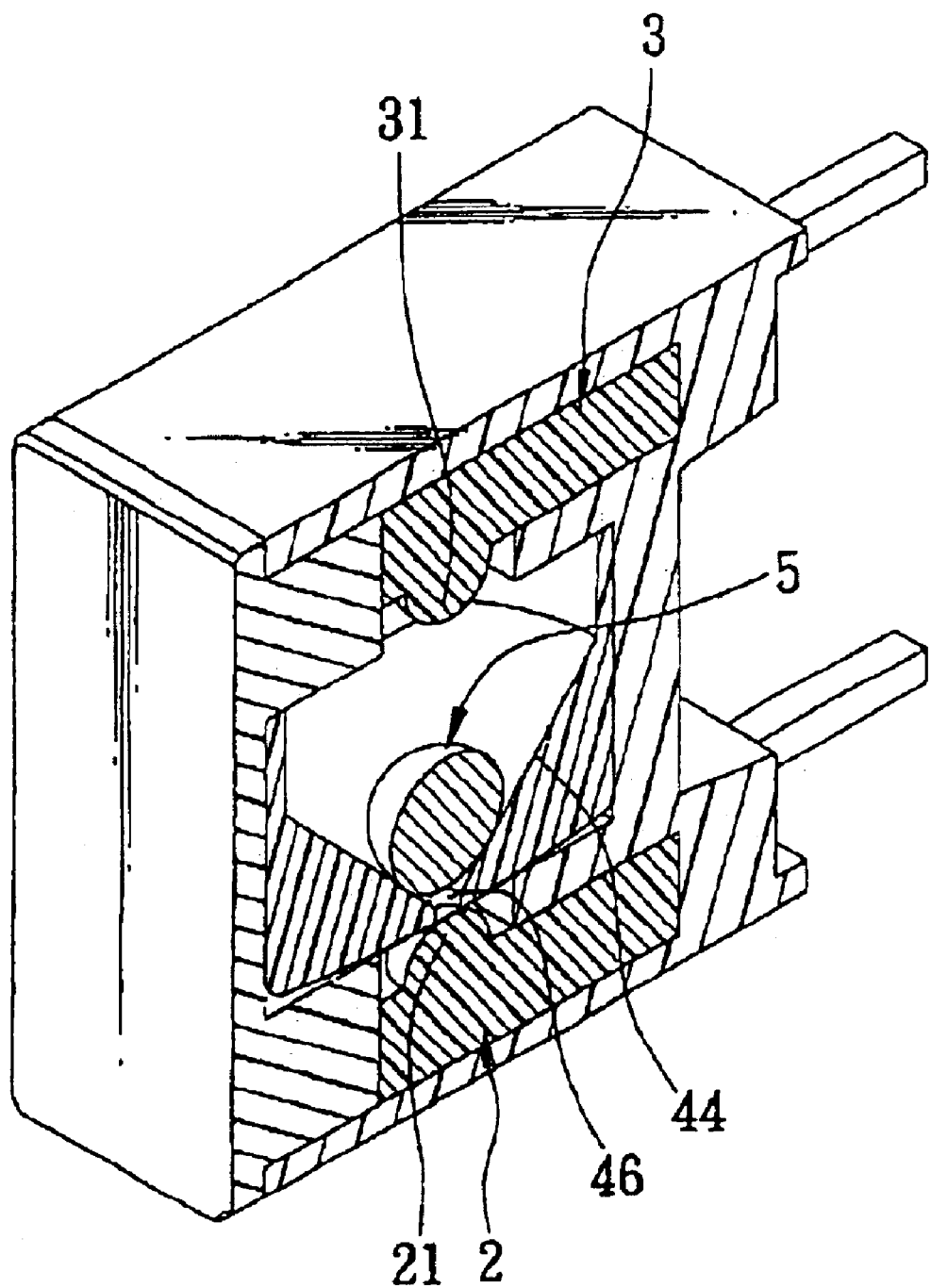
FIG. 4 is a fragmentary perspective view of the first preferred embodiment when tilted.

As illustrated, when the housing body 1 is steady in the upright direction, the ball member 5 is displaced to the surrounding area to steer clear of the intersection so as to permit the narrower beam of incident light to pass through the receiving slit 122 for reception by the receiving point 31, as shown in FIG. 3, thereby placing the optoelectronic switch in a first switch state, i.e. a switch-off state. Once the ball member 5 is lurched as a result of tilting to roll across the intersection from the first position to the second position, the ball member 5 is displaced to the central area of the rolling surface 44, and the optoelectronic switch 32 shifts from the first switch state to a second switch state, as shown in FIG. 4, thereby interrupting the transmission of the narrower beam of incident light.

Figure 5:
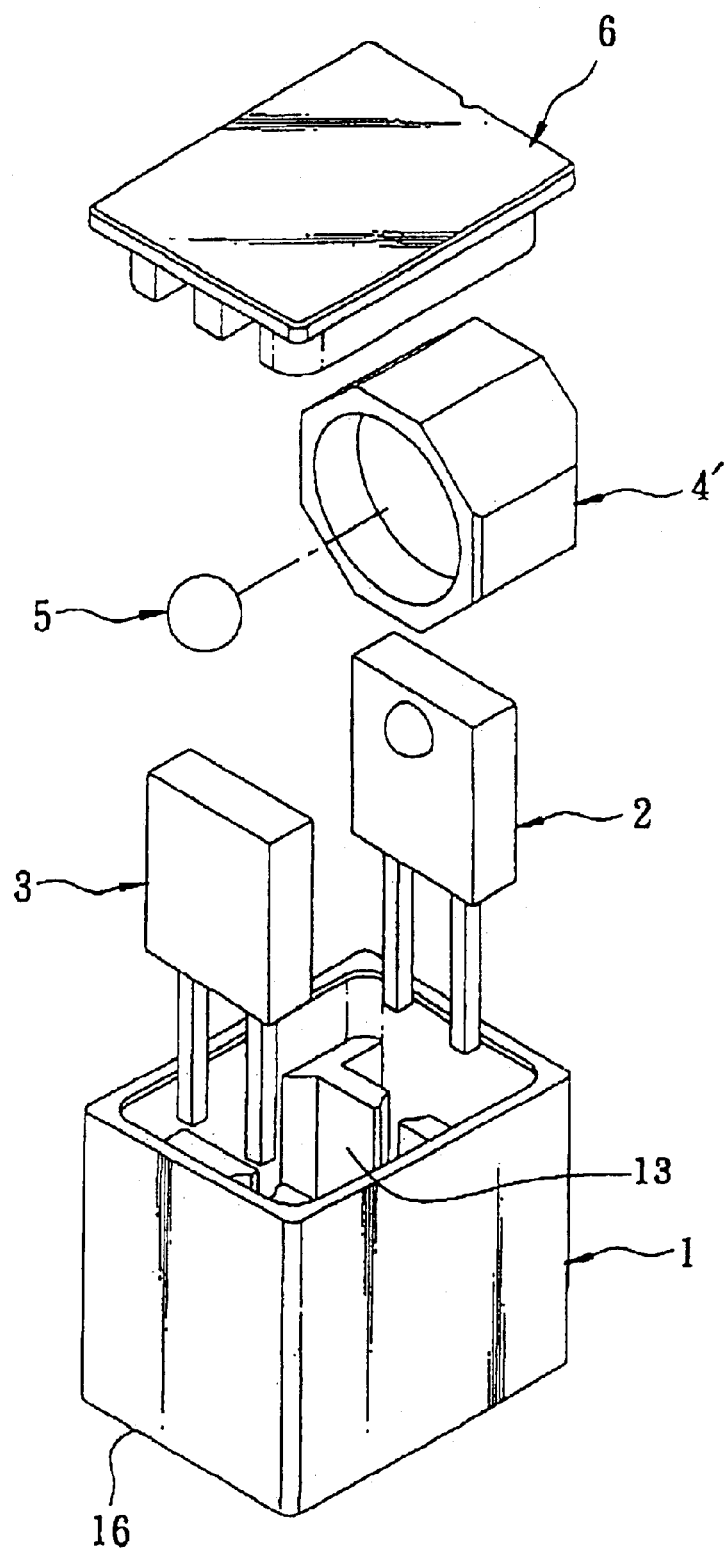
FIG. 5 is an exploded perspective view of a second preferred embodiment of a tilt switch according to this invention.
Figure 6:
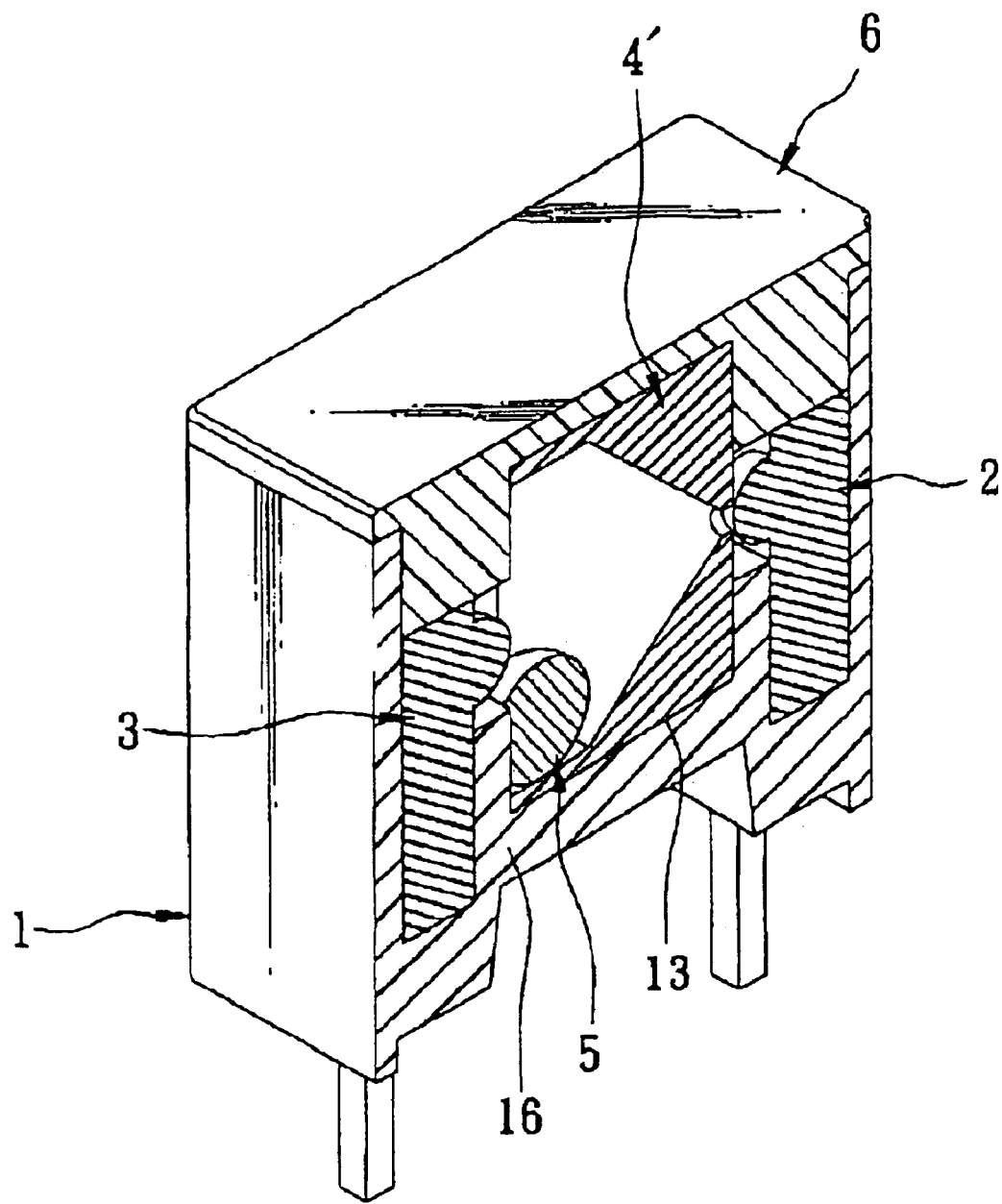
FIG. 6 is a fragmentary perspective view of the second preferred embodiment in an upright state.

Referring to FIGS. 5 and 6, the second preferred embodiment of the tilt switch of this invention is shown to be similar to the first preferred embodiment in construction, except that the modular insert body 4' has a polyhedral outer wall surface with a flat lower abutment region which abuts against the flat bottom wall surface of the bottom wall 16 so as to be retained firmly in the modular concavity 13.

Figure 7:
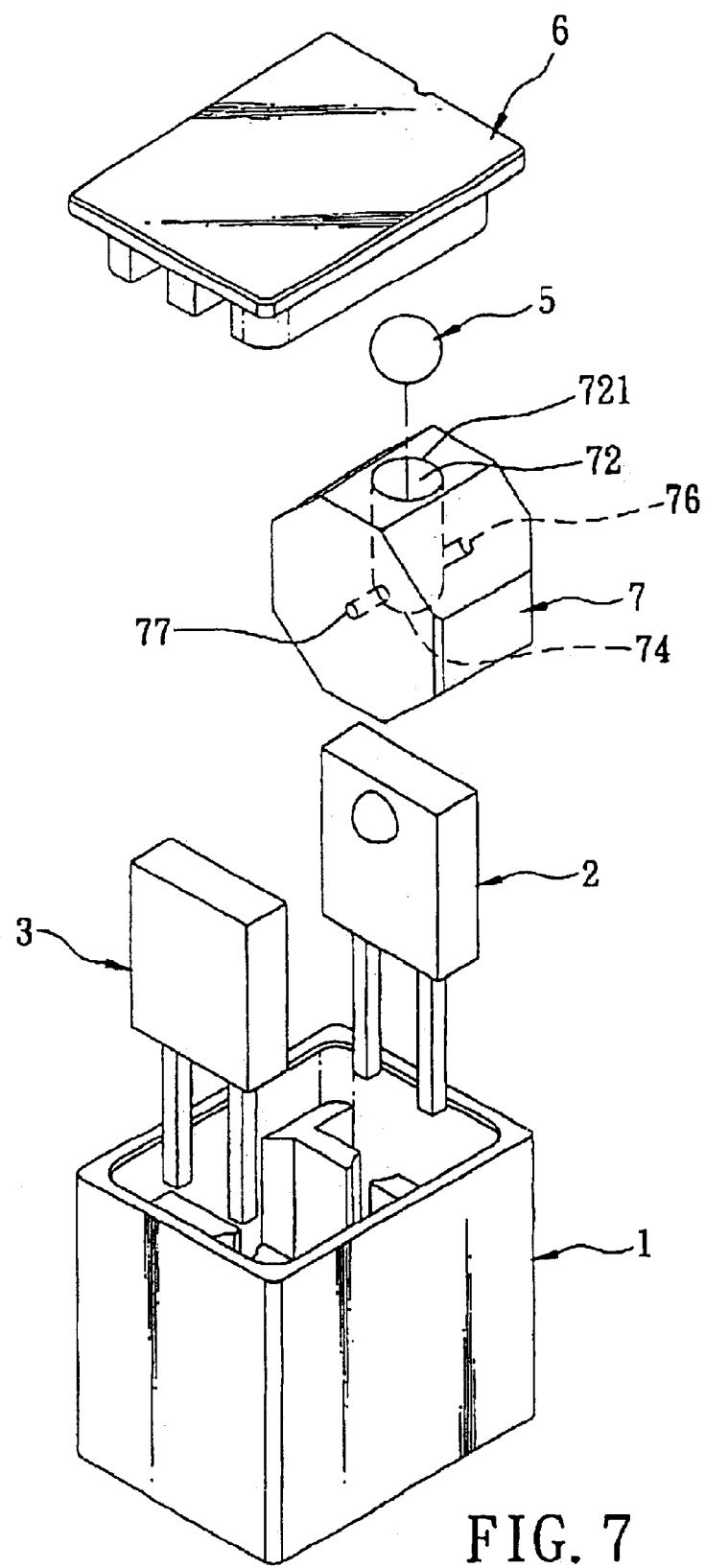
FIG. 7 is an exploded perspective view of a third preferred embodiment of a tilt switch according to this invention.
Figure 8:
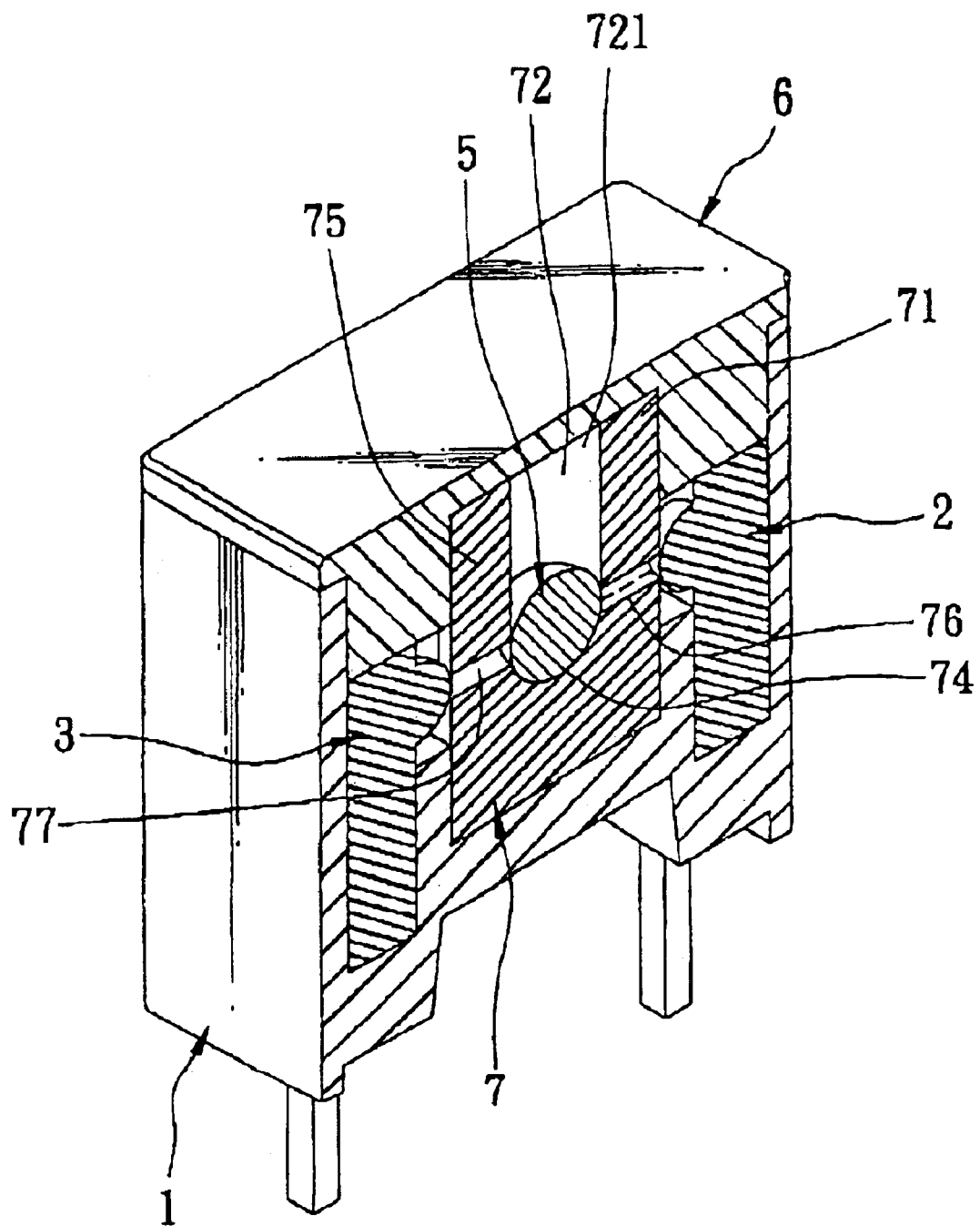
FIG. 8 is a fragmentary perspective view of the third preferred embodiment in an upright state.

Referring to FIGS. 7 and 8, the third preferred embodiment of the tilt switch of this invention is shown to be similar to the second preferred embodiment in construction, except that the accommodation chamber of the modular insert body 7 is in the form of a cylindrical tubular recess 72 which extends downwardly and in the upright direction, which has an upper access opening 721 to permit insertion of the ball member 5 into the recess 72, and which is dimensioned to define the transit route that extends in the upright direction for displacement of the ball member 5 in the upright direction between the first and second positions. Two through holes 76,77 are respectively formed in the entry and exit walls 71,75 and extend in the longitudinal direction to communicate with the recess 72. The through hole 76 serves as the entry hole. In addition, the cylindrical tubular recess 72 terminates at a curved lower region 74 which is disposed opposite to the upper access opening 721 relative to the light path. When the housing body 1 is steady in the upright direction, the ball member 5 is located in the lower region 74 to interrupt the transmission of the narrower beam of incident light from the light emitting unit 2 so as to place the optoelectronic switch in the first switch state, i.e. the switch-off state. When the housing body 1 is tilted, the ball member 5 rolls out of the lower region 74 to restore the transmission of the narrower beam of incident light so as to place the optoelectronic switch in the second switch state, i.e. the switch-on state.

Figure 9:
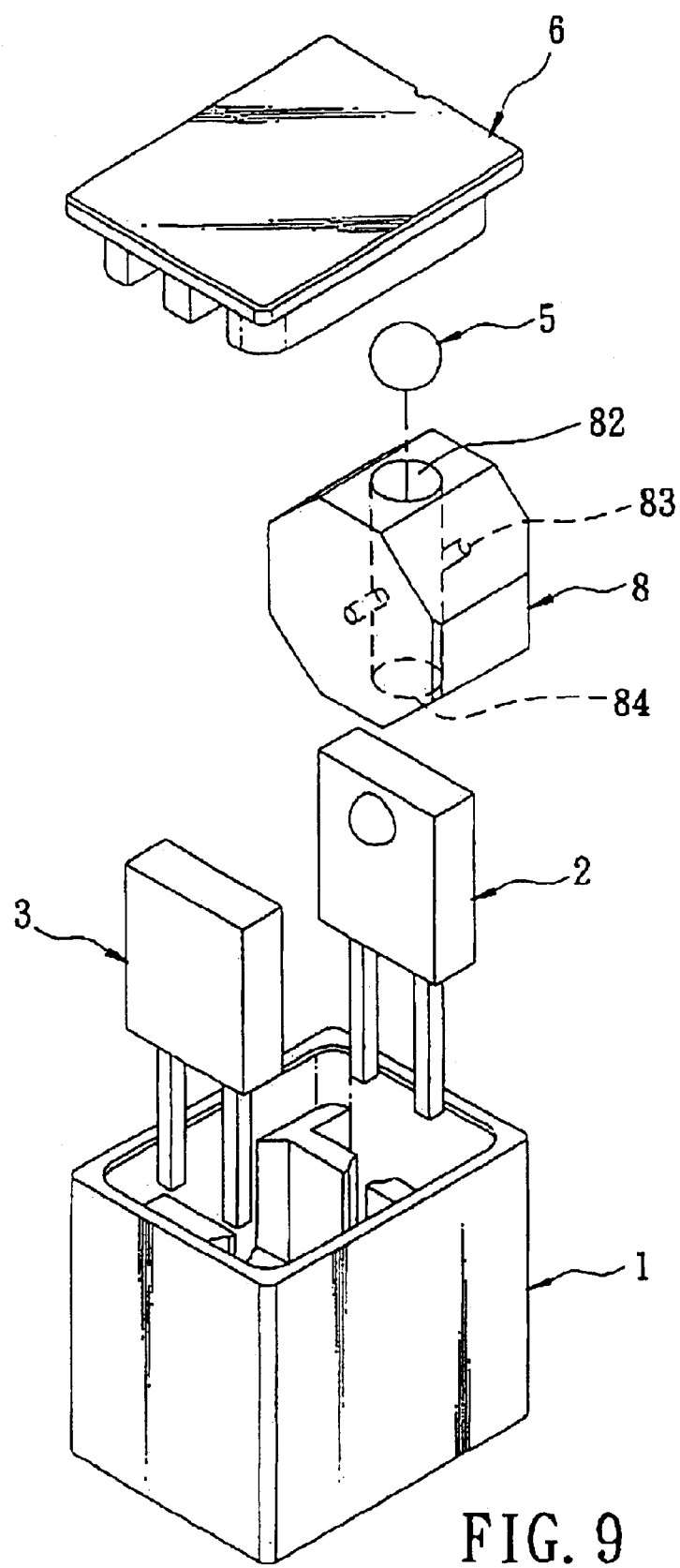
FIG. 9 is an exploded perspective view of a fourth preferred embodiment of a tilt switch according to this invention.
Figure 10:
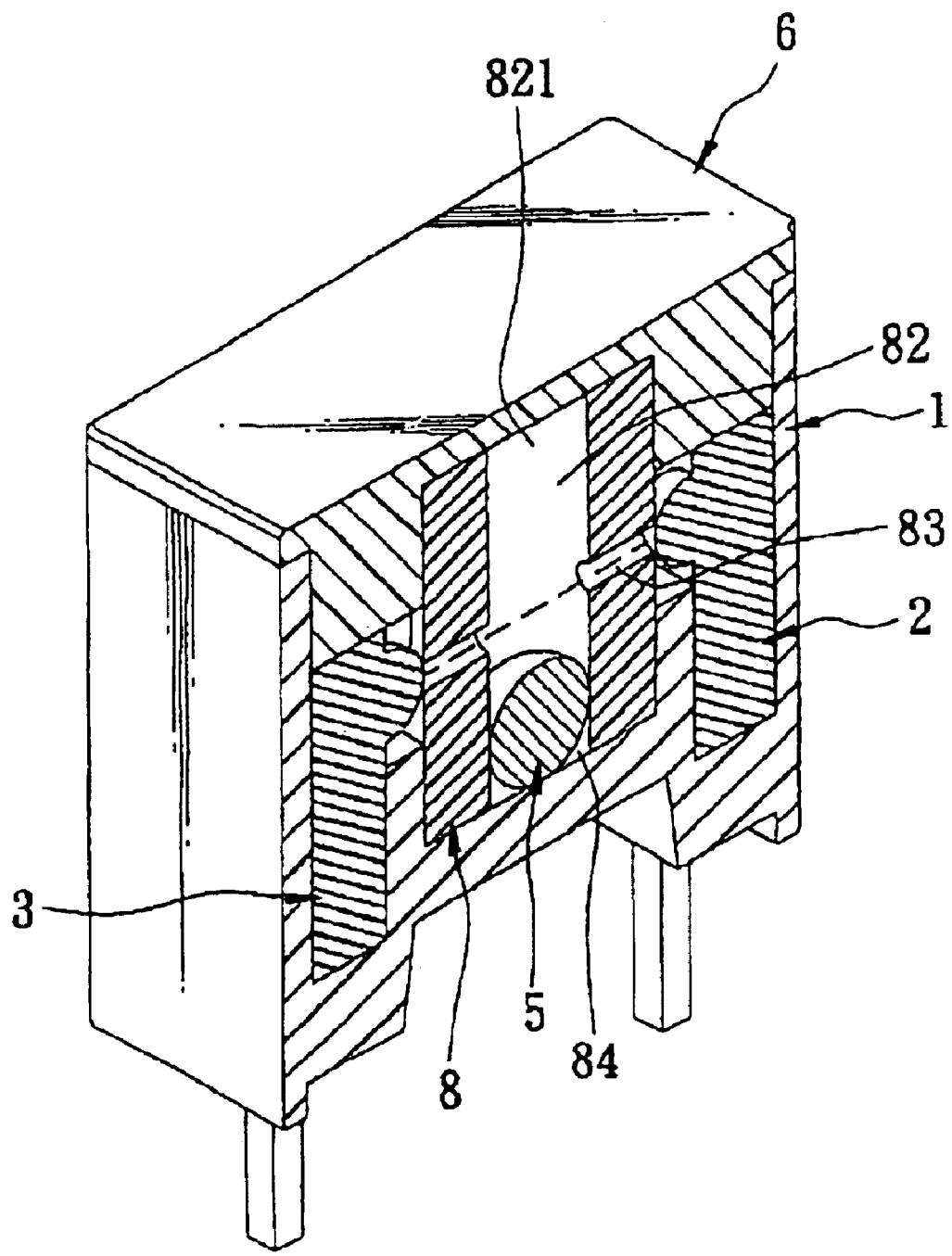
FIG. 10 is a fragmentary perspective view of the fourth preferred embodiment in an upright state.

Referring to FIGS. 9 and 10, the fourth preferred embodiment of the tilt switch of this invention is shown to be similar to the third preferred embodiment in construction, except that the cylindrical tubular recess 82 in the modular insert body 8 extends downwardly through the modular insert body 8 to terminate at a lower region 84 which is disposed opposite to the upper access opening 821 relative to the light path and which is underneath the entry hole 83. As such, when the housing body 1 is steady in the upright direction, the ball member 5 is located in the lower region 84 where the ball member 5 steers clear of the intersection so as to permit the transmission of the narrower beam of incident light, and when the housing body 1 is tilted, the ball member 5 is displaced across the intersection so as to interrupt the transmission of the narrower beam of incident light.

Figure 11:
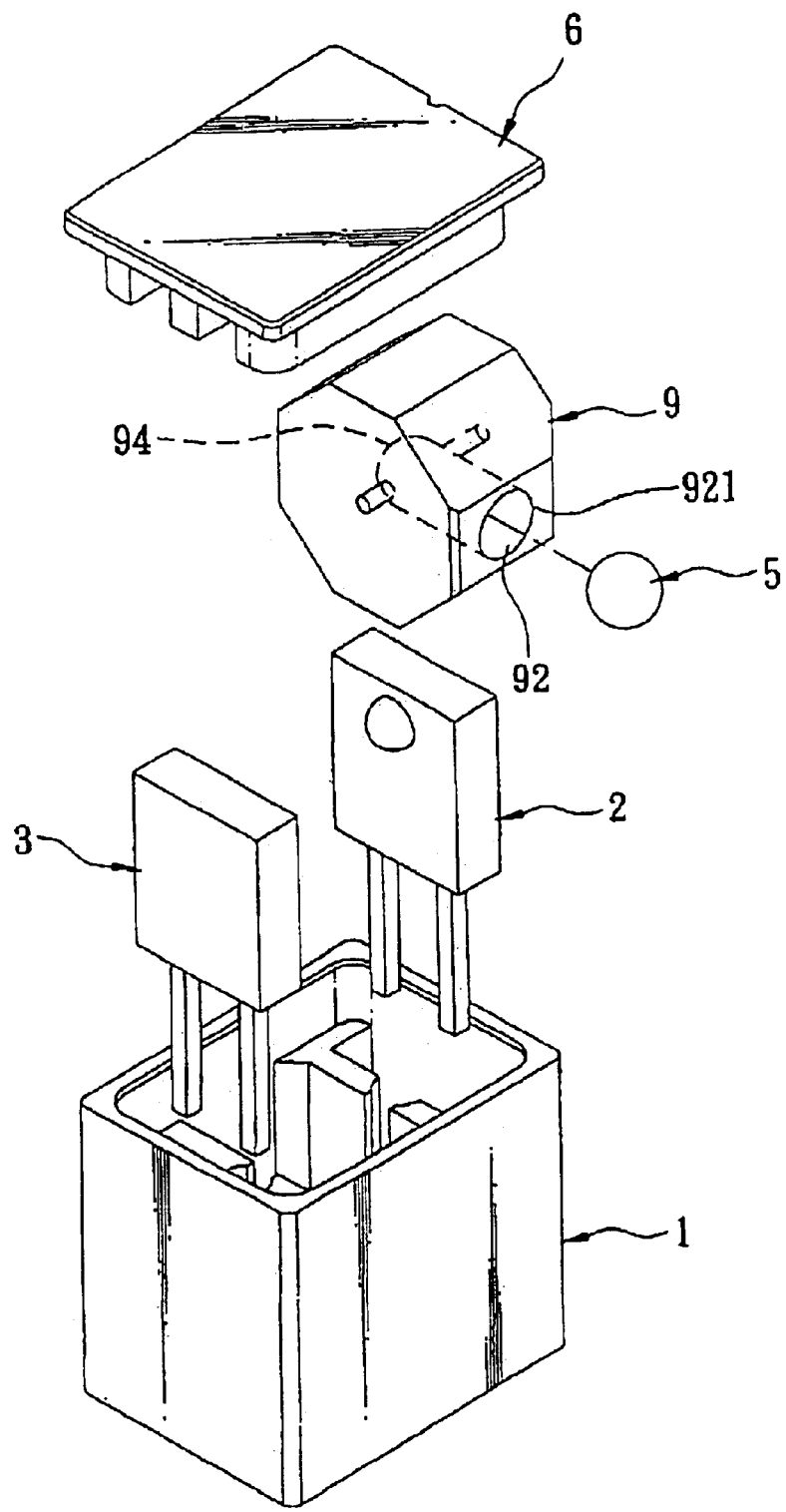
FIG. 11 is an exploded perspective view of a fifth preferred embodiment of a tilt switch according to this invention.
Figure 12:
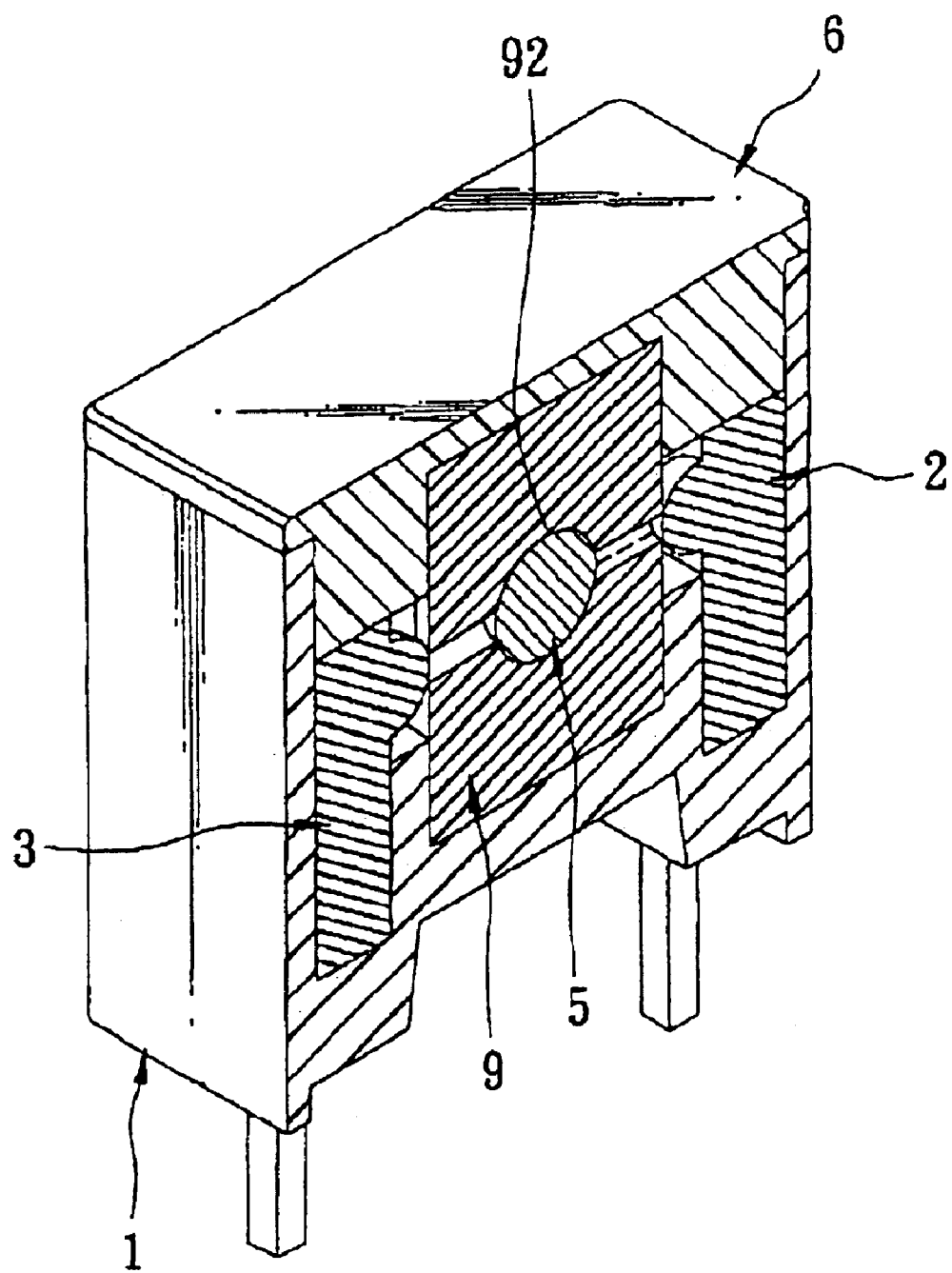
FIGS. 12 and 13 are fragmentary perspective views of the fifth preferred embodiment in an upright state.
Figure 13:
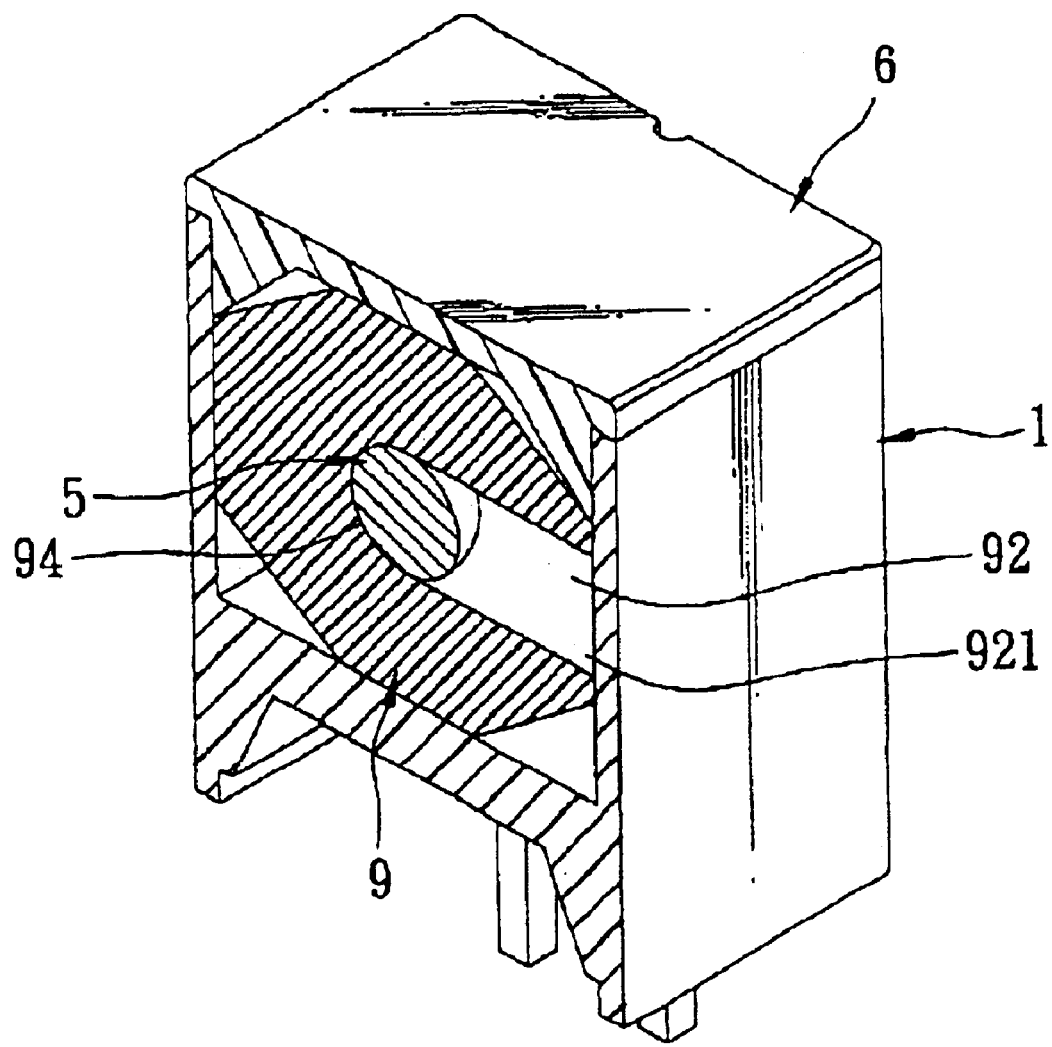

Referring to FIGS. 11 to 13, the fifth preferred embodiment of the tilt switch of this invention is shown to be similar to the fourth preferred embodiment in construction, except that the accommodation chamber of the modular insert body 9 is in the form of a cylindrical tubular recess 92 which extends in a transverse direction transverse to both the longitudinal direction and the upright direction, and which is dimensioned to define the transit route that extends in the transverse direction for displacement of the ball member 5 in the transverse direction between the first and second positions. The cylindrical tubular recess 92 has a front access opening 921 for insertion of the ball member 5 into the recess 92, and a curved rear region 94 which is opposite to the front access opening 921 in the transverse direction and relative to the light path. When the housing body 1 is steady in the upright direction, the ball member 5 rolls out of the rear region 94 so as to permit the transmission of the narrower beam of incident light, and when the housing body 1 is tilted, the ball member 5 is disposed in the rear region 94 so as to interrupt the transmission of the narrower beam of incident light.

Figure 14:
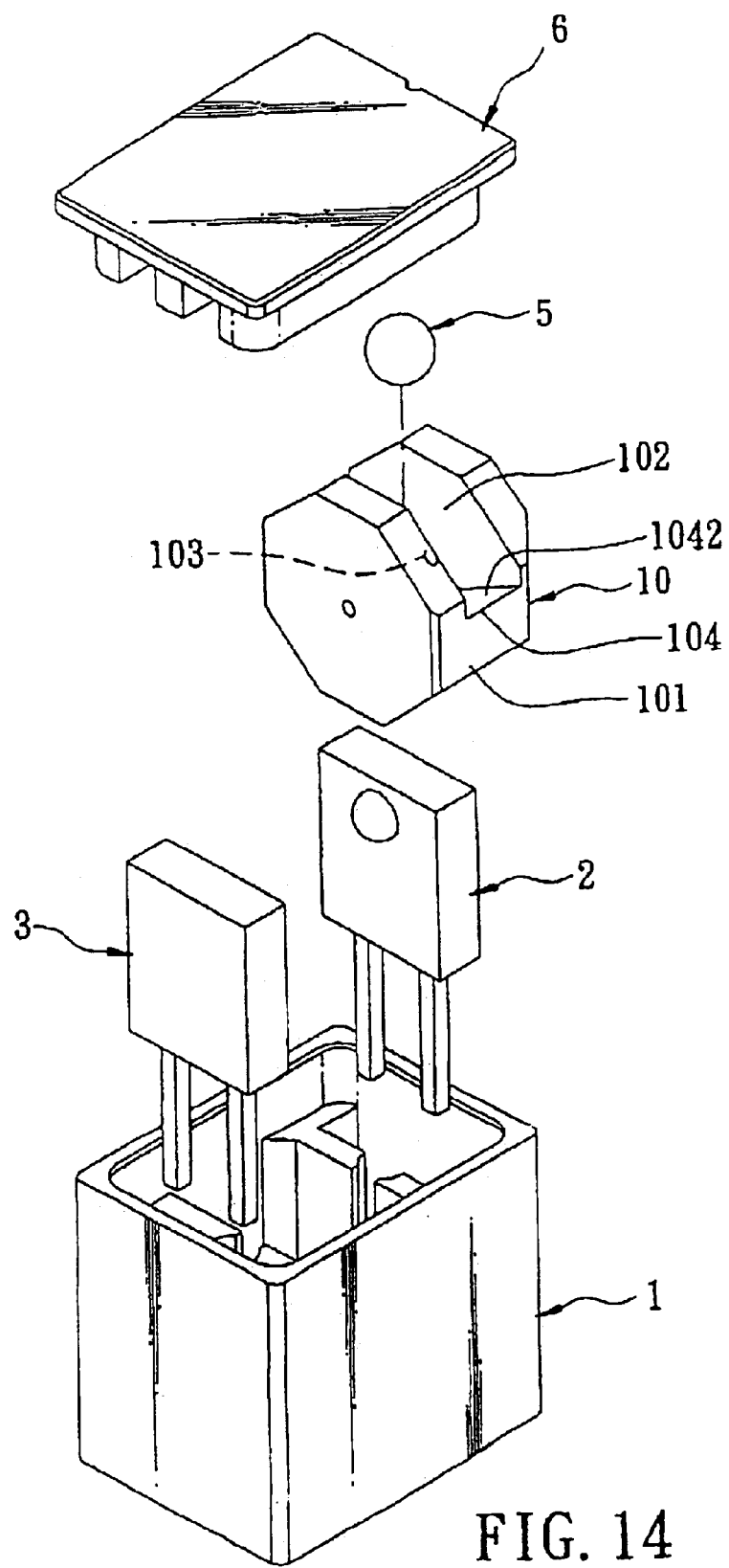
FIG. 14 is an exploded perspective view of a sixth preferred embodiment of a tilt switch according to this invention.
Figure 15:
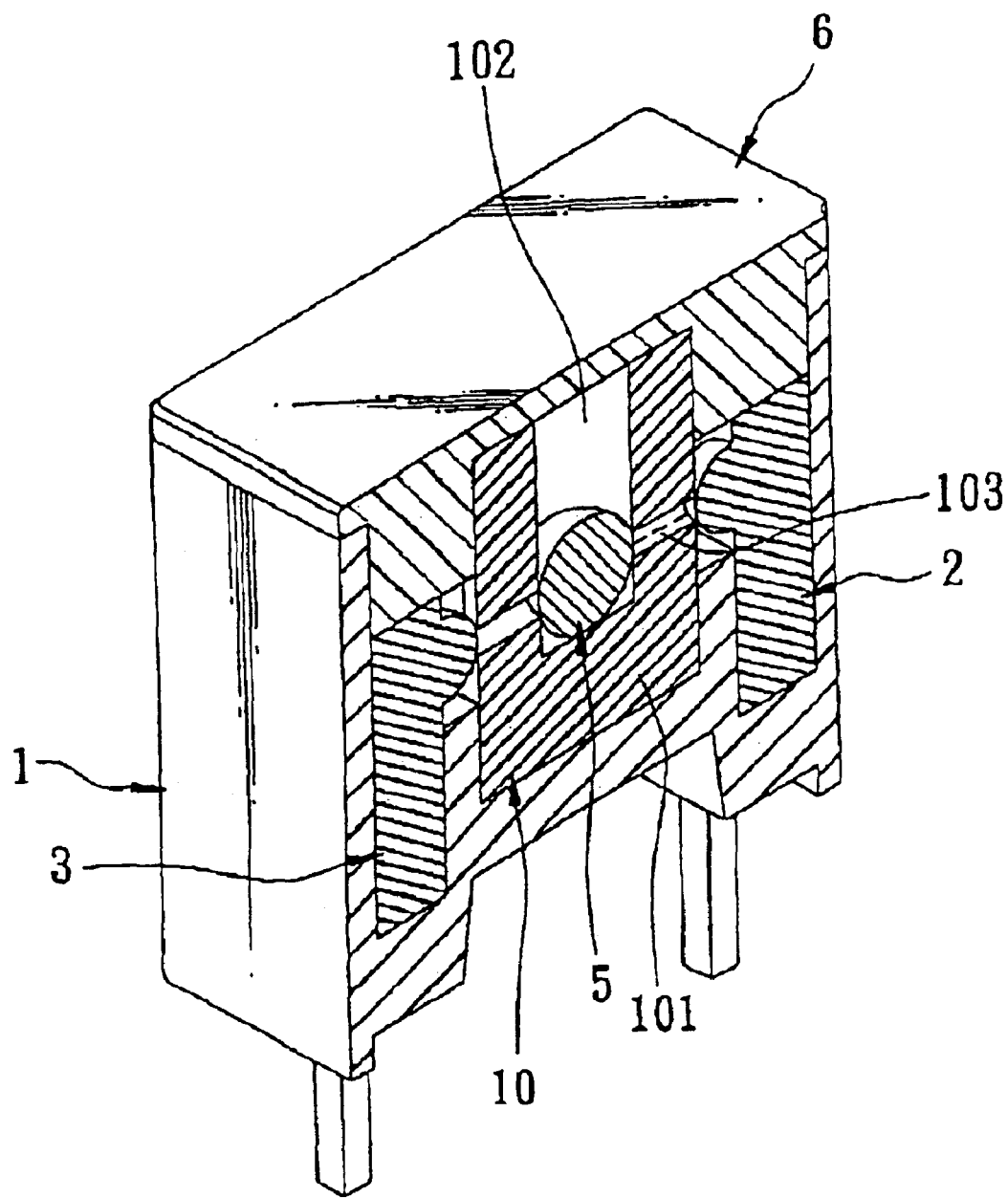
FIGS. 15 and 16 are fragmentary perspective views of the sixth preferred embodiment in an upright state.
Figure 16:
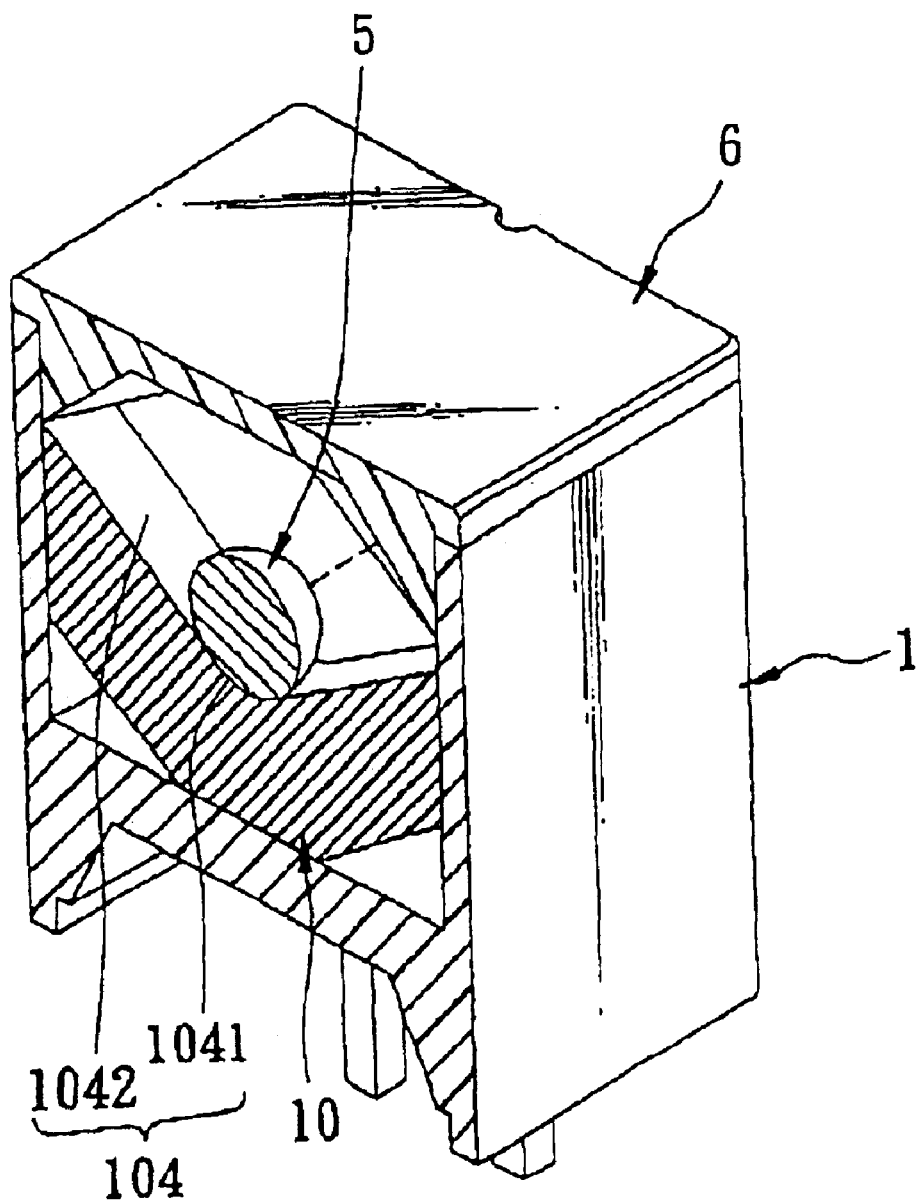

Referring to FIGS. 14 to 16, the sixth preferred embodiment of the tilt switch of this invention is shown to be similar to the fifth preferred embodiment in construction, except that the inner peripheral wall 101 of the modular insert body 10 has a lower rolling surface 104 which defines a bottom end of the accommodation chamber 102, which includes a central area 1041 and a surrounding area 1042 surrounding the central area 1041, and which is inclined from the surrounding area 1042 to the central area 1041 radially and in the upright direction so as to locate the ball member 5 at the central and surrounding areas 1041,1042 respectively when in the first and second positions. The entry hole 103 extends in the longitudinal direction to communicate with the recess 102 such that when the housing body 1 is steady in the upright direction, the ball member 5 is displaced to the central area 1041 and across the light path so as to interrupt the transmission of the narrower beam of incident light, and such that when the housing body 1 is tilted, the ball member 5 is displaced to the surrounding area 1042 to steer clear of the intersection so as to permit the transmission of the narrower beam of incident light.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

I claim:

1. A tilt switch adapted to be in electric contact with a support, said tilt switch comprising:

a housing body adapted to be mounted on the support in an upright direction, and including:
 a top wall which extends in a longitudinal direction that is transverse to the upright direction, and which has a modular concavity extending downwardly,
 a bottom wall which has a bottom wall surface that confronts said modular concavity and that is spaced apart from said top wall by a modular depth, and
 right and left inner modular walls which are spaced apart from each other by a modular width to confine said concavity in the longitudinal direction, and which have respectively emitting and receiving slits that extend respectively therethrough in both the longitudinal and upright directions, and that are aligned with each other in the longitudinal direction to permit passage of a broader beam of light;

light emitting and receiving units which are disposed in said housing body, and which are respectively disposed rightwardly and leftwardly of said right and left inner modular walls to respectively emit and receive the broader beam of light that passes through said emitting and receiving slits;

a modular insert body including:
 entry and exit walls which are opposite to and which are distant from each other in the longitudinal direction by a modular thickness that is slightly smaller than the modular width, said entry wall having an entry hole which extends in the longitudinal direction and towards said exit wall, and which is configured to admit entry of only a portion of the broader beam of light into said entry hole, thereby forming a narrower beam of incident light in said entry hole so as to continue to pass through said receiving slit along a light path when said modular insert body is inserted into said concavity in the upright direction to contact said bottom wall surface of said bottom wall and when said entry and exit walls are brought to confront said right and left inner modular walls, respectively, and
 an inner peripheral wall disposed between said entry and exit walls to confine an accommodation chamber which extends in the longitudinal direction to communicate with said entry hole, and which has a transit route that extends to intersect the light path at an intersection;

a ball member received in said accommodating chamber, rollable across said intersection, and displaceable from a first position where said housing body is steady in the upright direction, to a second position where said housing body is tilted relative to the upright direction;

an optoelectronic sensor member which is secured to said housing body, and which includes two electric contact terminals that extend downwardly and outwardly of said housing body so as to be adapted to be connected electrically to the support, and an optoelectronic switch which electrically couples said electric contact to said light receiving unit such that said optoelectronic switch shifts from a first switch state to a second switch state when said ball member is lurched as a result of tilting to roll across said intersection from the first position to the second position, thereby interrupting or restoring the transmission of the narrower beam of incident light; and a modular cover configured to cover said modular concavity so as to prevent ambient light from entering thereinto.

2. A tilt switch according to claim 1, wherein said entry wall has a rolling surface which includes a central area and a surrounding area surrounding said central area, and which is inclined from said surrounding area to said central area radially and in the longitudinal direction so as to locate said ball member at said central and surrounding areas respectively when in the second and first positions, said entry hole being formed in said central area and extending along the light path such that when said housing body is steady in the upright direction, said ball member is displaced to said surrounding area to steer clear of said intersection so as to permit the narrower beam of incident light to pass through said receiving slit, thereby placing said optoelectronic switch in the first switch state, and such that when said housing body is tilted, said ball member is displaced to said central area across said intersection to interrupt the transmission of the narrower beam of incident light so as to place said optoelectronic switch in the second switch state.

3. A tilt switch according to claim 2, wherein said inner peripheral wall has an inner cylindrical wall surface which extends from said surrounding area in the longitudinal direction to confine said accommodation chamber and which terminates at said exit wall to define a left access opening configured to permit insertion of said ball member into said accommodation chamber.

4. A tilt switch according to claim 1, wherein said modular insert body has an outer cylindrical wall surface which surrounds the light path, and which has a lower abutment region that abuts against said bottom wall surface of said bottom wall when said modular insert body is inserted into said concavity.

5. A tilt switch according to claim 1, wherein said accommodation chamber is in form of a cylindrical tubular recess which extends in the upright direction towards said bottom wall surface, and which has an upper access opening to permit insertion of said ball member into said recess, said recess being dimensioned to define said transit route that extends in the upright direction for displacement of said ball member in the upright direction between the first and second positions.

6. A tilt switch according to claim 5, wherein said cylindrical tubular recess terminates at a lower region which is disposed opposite to said upper access opening relative to the light path such that when said housing body is steady in the upright direction, said ball member is located in said lower region to interrupt the transmission of the narrower beam of incident light so as to place said optoelectronic switch in the first switch state, and such that when said housing body is tilted, said ball member rolls out of said lower region to restore the transmission of the narrower beam of incident light so as to place said optoelectronic switch in the second switch state.

7. A tilt switch according to claim 5, wherein said cylindrical tubular recess extends in the upright direction through said modular insert body to terminate at a lower region which is disposed opposite to said upper access opening relative to the light path such that when said housing body is steady in the upright direction, said ball member is located in said lower region where said ball member steers clear of said intersection so as to permit the narrower beam of incident light to pass through said receiving slit, and such that when said housing body is tilted, said ball member is displaced across said intersection so as to interrupt the transmission of the narrower beam of incident light.

8. A tilt switch according to claim 1, wherein said accommodation chamber is in form of a cylindrical tubular recess which extends in a transverse direction transverse to both the longitudinal direction and the upright direction, and which is dimensioned to define said transit route that extends in the transverse direction for displacement of said ball member in the transverse direction between the first and second positions, said cylindrical tubular recess having a front access opening for insertion of said ball member into said recess, and a rear region which is opposite to said front access opening in the transverse direction and relative to the light path such that when said housing body is steady in the upright direction, said ball member rolls out of said rear region so as to permit the transmission of the narrower beam of incident light, and such that when said housing body is tilted, said ball member is disposed in said rear region so as to interrupt the transmission of the narrower beam of incident light.

9. A tilt switch according to claim 1, wherein said inner peripheral wall has a lower rolling surface which defines a bottom end of said accommodation chamber, which includes a central area and a surrounding area surrounding said central area, and which is inclined from said surrounding area to said central area radially and in the upright direction so as to locate said ball member at said central and surrounding areas respectively when in the first and second positions, said entry hole being located such that when said housing body is steady in the upright direction, said ball member is displaced to said central area and across the light path so as to interrupt the transmission of the narrower beam of incident light, and such that when said housing body is tilted, said ball member is displaced to said surrounding area to steer clear of said intersection so as to permit the narrower beam of incident light to pass through said receiving slit.

10. A tilt switch according to claim 1, wherein said modular cover has a lower abutment surface which abuts against said modular insert body so as to retain said modular insert body to abut against said bottom wall surface of said bottom wall.

* * * * *